United States Patent
Wu et al.

(10) Patent No.: US 9,281,074 B2
(45) Date of Patent: Mar. 8, 2016

(54) ONE TIME PROGRAMMABLE MEMORY CELL CAPABLE OF REDUCING LEAKAGE CURRENT AND PREVENTING SLOW BIT RESPONSE

(71) Applicant: eMemory Technology Inc., Hsin-Chu (TW)

(72) Inventors: Meng-Yi Wu, Hsinchu County (TW); Chih-Hao Huang, Hsinchu County (TW); Hsin-Ming Chen, Hsinchu (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/222,684

(22) Filed: Mar. 24, 2014

(65) Prior Publication Data
US 2014/0340955 A1 Nov. 20, 2014

Related U.S. Application Data

(60) Provisional application No. 61/823,928, filed on May 16, 2013.

(51) Int. Cl.
*G11C 17/16* (2006.01)
*H01L 27/10* (2006.01)
*H01L 27/112* (2006.01)
*G11C 17/18* (2006.01)
(Continued)

(52) U.S. Cl.
CPC ............ *G11C 17/16* (2013.01); *G11C 17/18* (2013.01); *H01L 27/101* (2013.01); *H01L 27/11206* (2013.01); *H01L 27/11286* (2013.01); *H01L 29/7833* (2013.01); *H01L 23/5252* (2013.01); *H01L 2924/0002* (2013.01)

(58) Field of Classification Search
CPC ..... G11C 17/165; G11C 17/146; G11C 17/14
USPC ................................ 365/96, 104, 103, 225.7
See application file for complete search history.

(56) References Cited

U.S. PATENT DOCUMENTS

| 8,638,589 B2 * | 1/2014 | Lu et al. .......................... 365/96 |
| 8,681,528 B2 * | 3/2014 | Wu et al. ....................... 365/104 |
| 2006/0203591 A1 | 9/2006 | Lee |

(Continued)

FOREIGN PATENT DOCUMENTS

| EP | 1 895 543 A2 | 3/2008 |
| JP | 2006245177 A | 9/2006 |

(Continued)

*Primary Examiner* — Andrew Q Tran
(74) *Attorney, Agent, or Firm* — Winston Hsu; Scott Margo

(57) ABSTRACT

The present invention provides a one time programmable (OTP) memory cell including a select gate transistor, a following gate transistor, and an antifuse varactor. The select gate transistor has a first gate terminal, a first drain terminal, a first source terminal, and two first source/drain extension areas respectively coupled to the first drain terminal and the first source terminal. The following gate transistor has a second gate terminal, a second drain terminal, a second source terminal coupled to the first drain terminal, and two second source/drain extension areas respectively coupled to the second drain terminal and the second source terminal. The antifuse varactor has a third gate terminal, a third drain terminal, a third source terminal coupled to the second drain terminal, and a third source/drain extension area coupled with the third drain terminal and the third source terminal for shorting the third drain terminal and the third source terminal.

10 Claims, 13 Drawing Sheets

(51) Int. Cl.
*H01L 29/78* (2006.01)
*H01L 23/525* (2006.01)

(56) References Cited

U.S. PATENT DOCUMENTS

2006/0221698 A1 10/2006 Obuchi
2008/0042234 A1 2/2008 Yamaguchi
2009/0262565 A1 10/2009 Shin
2009/0267160 A1 10/2009 Ichise
2011/0108923 A1 5/2011 Kubota

FOREIGN PATENT DOCUMENTS

| JP | 200847248 A | 2/2008 |
| JP | 2009259385 A | 11/2009 |
| JP | 2009267229 A | 11/2009 |
| JP | 2010147072 A | 7/2010 |
| JP | 2011119640 A | 6/2011 |

* cited by examiner

ONE TIME PROGRAMMABLE MEMORY CELL CAPABLE OF REDUCING LEAKAGE CURRENT AND PREVENTING SLOW BIT RESPONSE

CROSS REFERENCE TO RELATED APPLICATIONS

This application claims the benefit of U.S. provisional application No. 61/823,928 filed May 16, 2013.

BACKGROUND OF THE INVENTION

1. Field of the Invention

The present invention relates to a one time programmable (OTP) memory cell, and more particularly, to a one time programmable memory cell capable of reducing current leakage.

2. Description of the Prior Art

Non-volatile memory (NVM) is a type of memory that retains information it stores even when no power is supplied to memory blocks thereof. Some examples include magnetic devices, optical discs, flash memory, and other semiconductor-based memory topologies. According to the programming times limit, non-volatile memory devices are divided into multi-time programmable (MTP) memory and one-time programmable (OTP) memory. As shown in FIG. 1, a conventional OTP memory cell 100 comprises a transistor 110 and an antifuse transistor 120. When programming the OTP memory cell 100, the antifuse transistor 120 is ruptured and behaves as a MOS capacitor, such that data of logic "1" is written into the OTP memory 100.

Please refer to FIG. 2 and FIG. 3 together. FIG. 2 is a diagram showing a good rupture status of the OTP memory cell of FIG. 1 after programming. FIG. 3 is a diagram showing a bad rupture status of the OTP memory cell of FIG. 1 after programming. As showing in FIG. 2, when a gate oxide layer Ox corresponding to a gate terminal G of the antifuse transistor 120 is ruptured near a source terminal S of the antifuse transistor 120, leakage current between the gate terminal G and the source terminal S is smaller. As showing in FIG. 3, when the gate oxide layer Ox corresponding to the gate terminal G of the antifuse transistor is ruptured near a channel area of the antifuse transistor 120, leakage current between the gate terminal G and the source terminal S is larger, since more current can escape through the channel area.

However, in the prior art, it is difficult to control rupture position of the gate oxide layer Ox, such that the OTP memory cell 100 of the prior art may work incorrectly or has slow bit response due to insufficient power caused by the leakage current.

SUMMARY OF THE INVENTION

The present invention provides a one time programmable (OTP) memory cell comprising a select gate transistor, a following gate transistor, and an antifuse varactor. The select gate transistor has a first gate terminal, a first drain terminal, a first source terminal, and two first source/drain extension areas respectively coupled to the first drain terminal and the first source terminal. The following gate transistor has a second gate terminal, a second drain terminal, a second source terminal coupled to the first drain terminal, and two second source/drain extension areas respectively coupled to the second drain terminal and the second source terminal. The antifuse varactor has a third gate terminal, a third drain terminal, a third source terminal coupled to the second drain terminal, and a third source/drain extension area coupled with the third drain terminal and the third source terminal for shorting the third drain terminal and the third source terminal.

The present invention further provides another one time programmable (OTP) memory cell, comprising a select gate transistor, a following gate transistor, and an antifuse varactor. The select gate transistor has a first gate terminal, a first drain terminal, a first source terminal, and two first source/drain extension areas respectively coupled to the first drain terminal and the first source terminal. The following gate transistor has a second gate terminal, a second drain terminal, a second source terminal coupled to the first drain terminal, and two second source/drain extension areas respectively coupled to the second drain terminal and the second source terminal. The antifuse varactor, having a third gate terminal, a third source terminal coupled to the second drain terminal, and a third source/drain extension area coupled to the third source terminal. Wherein a part of the third gate terminal is formed right above a shallow trench insulation, and rest of the third gate terminal is formed right above the third source/drain extension area.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
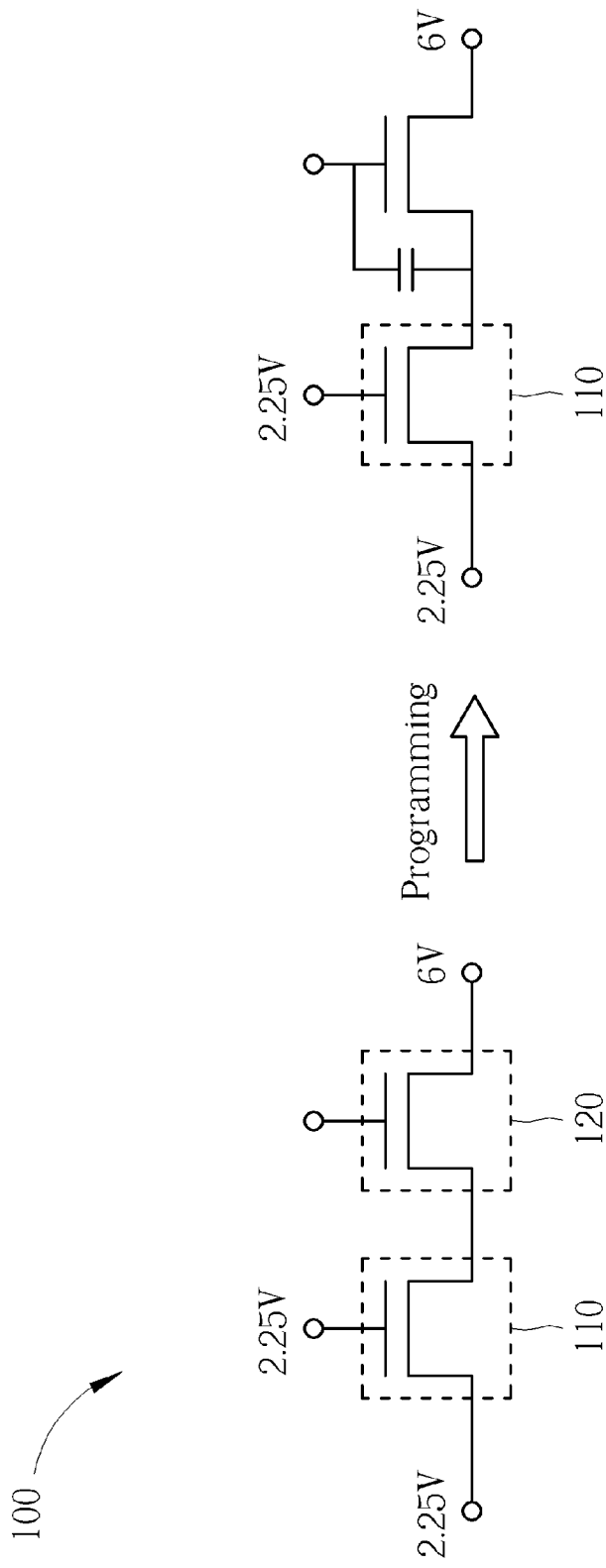
FIG. 1 is a diagram showing an equivalent circuit of a conventional OTP memory cell.
Figure 2:
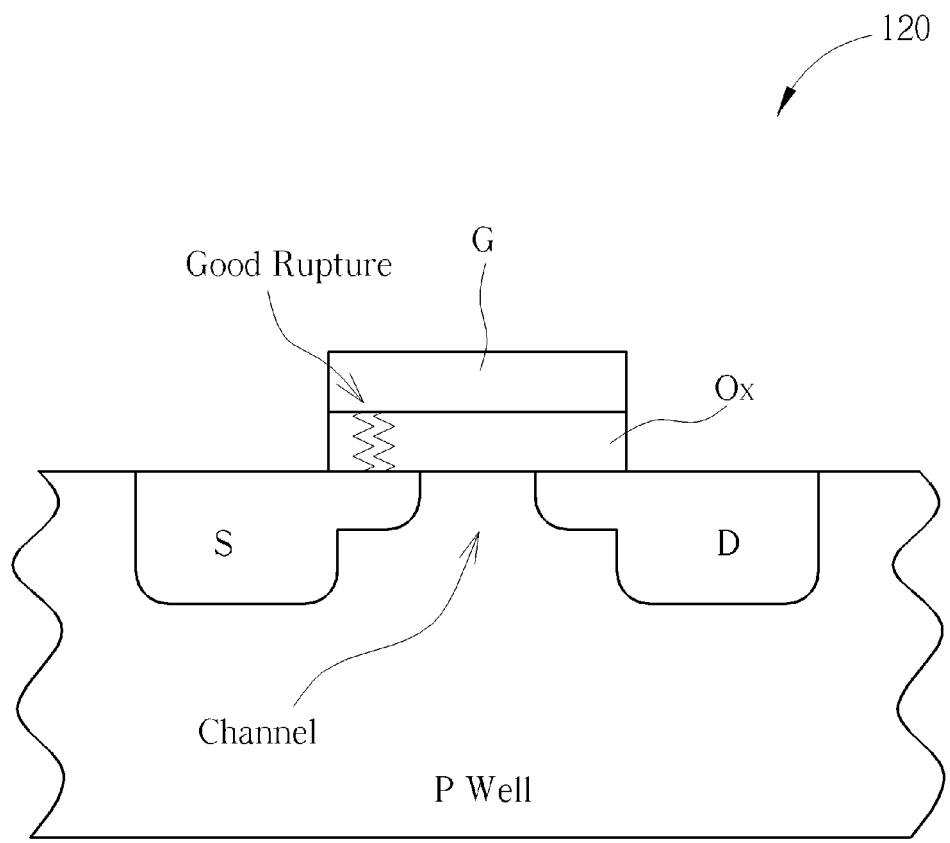
FIG. 2 is a diagram showing a good rupture status of the OTP memory cell of FIG. 1 after programming.
Figure 3:
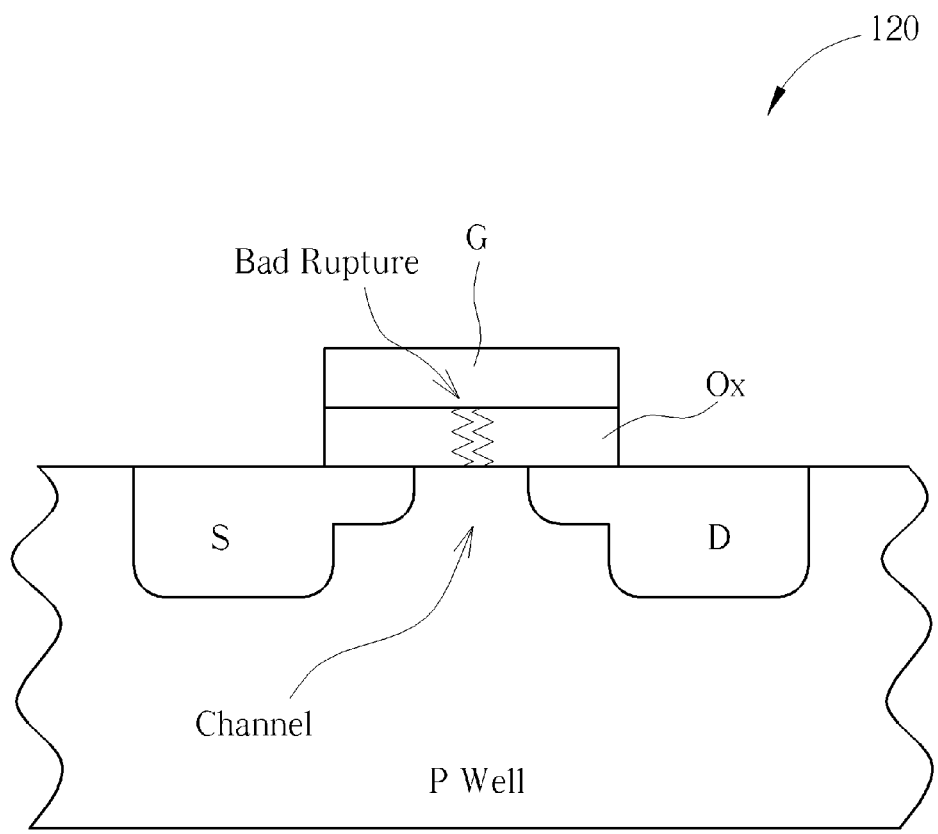
FIG. 3 is a diagram showing a bad rupture status of the OTP memory cell of FIG. 1 after programming.
Figure 4:
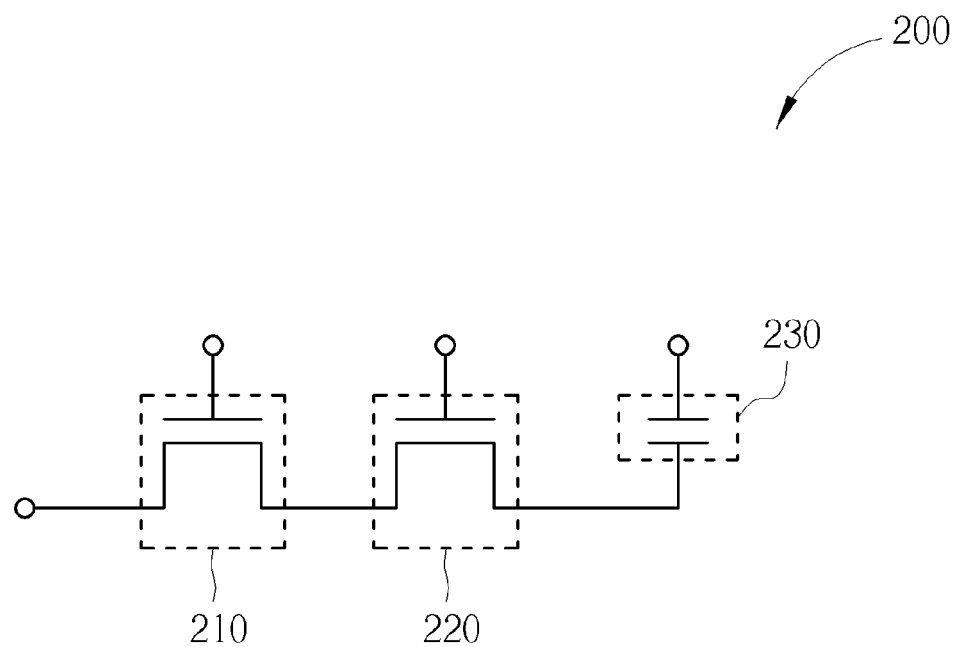
FIG. 4 is a diagram showing an equivalent circuit of an one time programmable (OTP) memory cell of the present invention.
Figure 5:
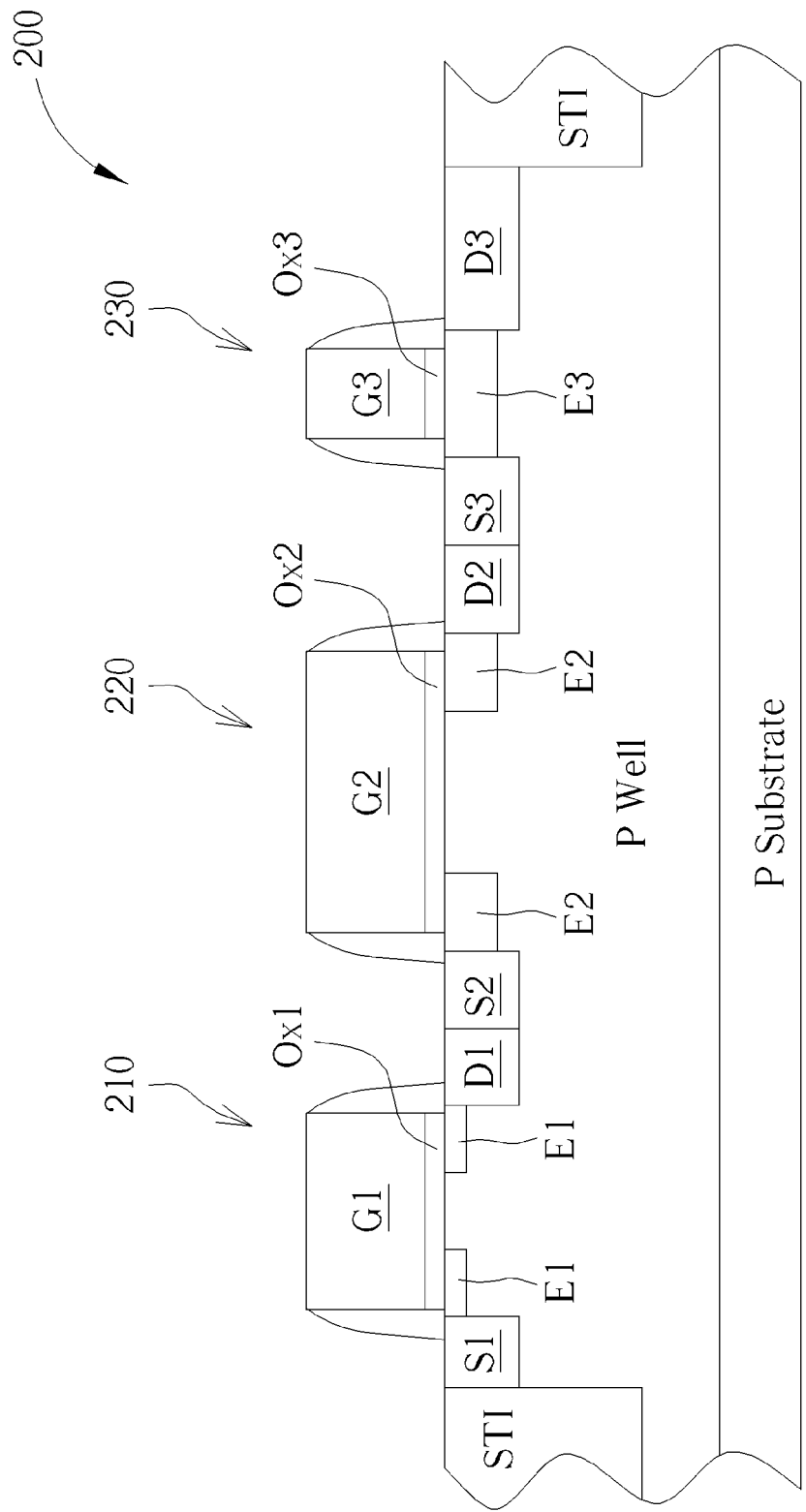
FIG. 5 is a diagram showing a structure of the OTP memory cell according to a first embodiment of the present invention.

Please refer to FIG. 4 and FIG. 5 together. FIG. 4 is a diagram showing an equivalent circuit of a one time programmable (OTP) memory cell of the present invention. FIG. 5 is a diagram showing a structure of the OTP memory cell according to a first embodiment of the present invention. As shown in the figures, the OPT memory cell 200 comprises a select gate transistor 210, a following gate transistor 220 and an antifuse varactor 230.

The select gate transistor 210 has a first gate terminal G1, a first drain terminal D1, a first source terminal S1, and two first source/drain extension areas E1 respectively coupled to the first drain terminal D1 and the first source terminal S1. The following gate transistor 220 has a second gate terminal G2, a second drain terminal D2, a second source terminal S2 coupled to the first drain terminal D1, and two second source/drain extension areas E2 respectively coupled to the second drain terminal D2 and the second source terminal S2. The antifuse varactor 230 can be a MOS varactor, and has a third gate terminal G3, a third drain terminal D3, a third source terminal S3 coupled to the second drain terminal D2, and a third source/drain extension area E3 coupled with the third drain terminal D3 and the third source terminal S3 for shorting the third drain terminal D3 and the third source terminal S3.

According to the above arrangement, since the third gate terminal G3 is formed right above the third source/drain extension area E3, and horizontal edges of the third gate terminal G3 are within horizontal edges of the third source/drain extension area E3, thus the antifuse varactor 230 has no channel. Therefore, when programming the OTP memory cell 200, the gate oxide layer Ox3 of the antifuse varactor 230 is ensured to be ruptured on the third source/drain extension area E3, so as to reduce possibility of current escaping through the channel. As a result, the OTP memory cell 200 of the present invention is capable of reducing leakage current, such that problems of slow bit response or malfunction can be prevented. Moreover, the series-connected following gate transistor 220 can reduce junction leakage in a program inhibition status.

In addition, each of the first source/drain extension areas E1 has a first depth, and each of the second and third source/drain extension areas E2, E3 has a second depth deeper than the first depth. For example, the first source/drain extension areas E1 can be source/drain extension areas for core devices, and the second and third source/drain extension areas E2, E3 can be source/drain extension areas for I/O devices, such that PN junction breakdown of the following gate transistor 220 can be prevented. Furthermore, the second source/drain extension area E2 can be asymmetric thus drain side extension is deeper than source side extension. For example, the second source extension of following gate transistor can be depth of core device and second drain extension can be depth of I/O device separately. Besides, gate oxide layers Ox1-Ox3 of the first to third gate terminals G1-G3 are for core devices, thus the gate oxide layers Ox1-Ox3 of the first to third gate terminals G1-G3 are thinner than gate oxide layers for I/O devices.

Figure 6:
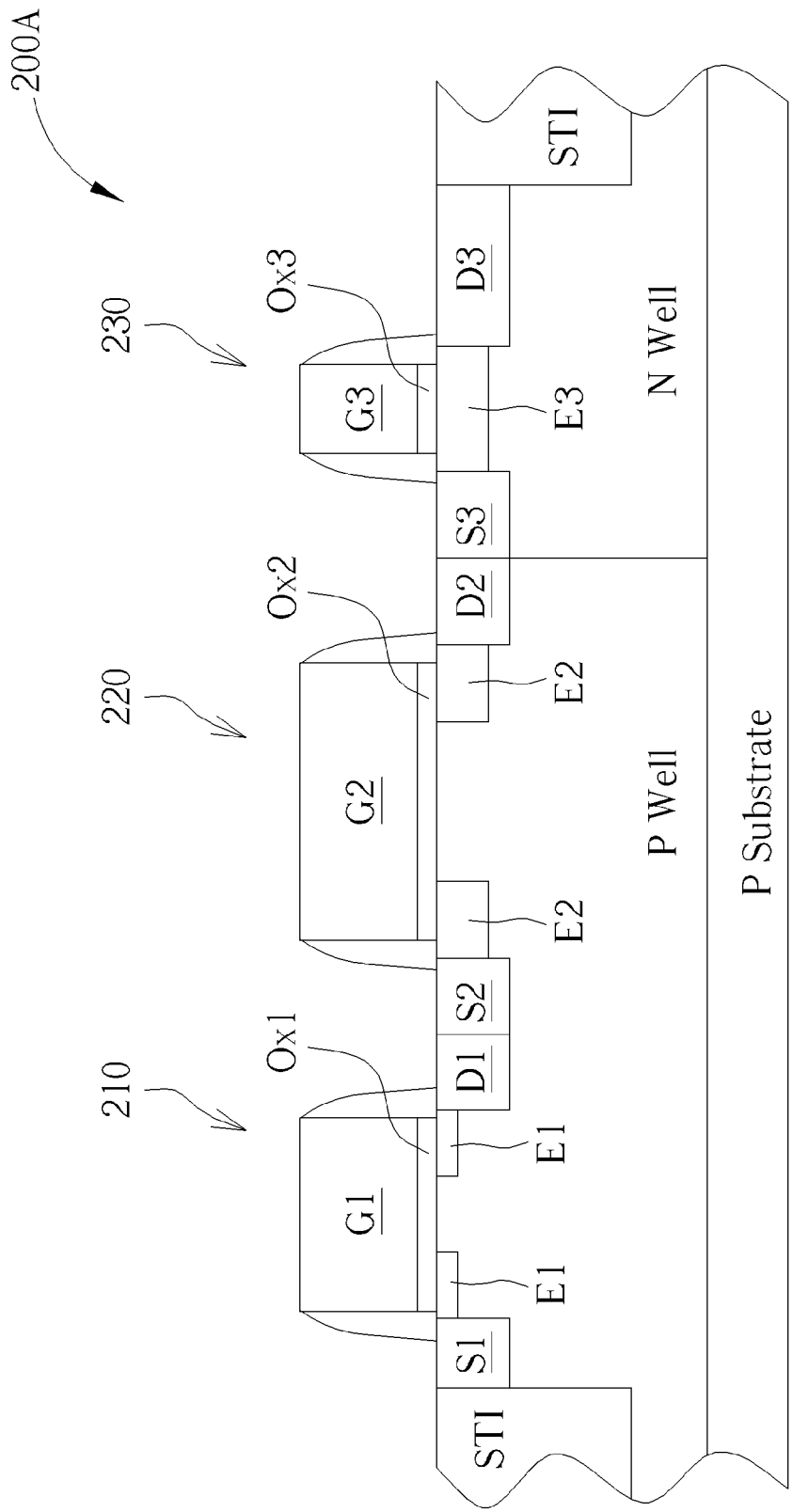
FIG. 6 is a diagram showing a structure of the OTP memory cell according to a second embodiment of the present invention.

Please refer to FIG. 6. FIG. 6 is a diagram showing a structure of the OTP memory cell according to a second embodiment of the present invention. Most features of the OTP memory cell 200A are identical to the OTP memory cell 200 of FIG. 5. As shown in FIG. 6, different from the OTP memory cell 200 of FIG. 5 all forming on a P well, the OTP memory cell 200A of FIG. 6 has the select gate transistor 210 and the following gate transistor 220 forming on a P well, and the antifuse varactor 230 forming on an N well. In addition, in the embodiment of FIG. 6, the third source/drain extension area E3 is not necessary, that is, the third source/drain extension area E3 can either exist, or be removed and replaced by the N well.

Figure 7:
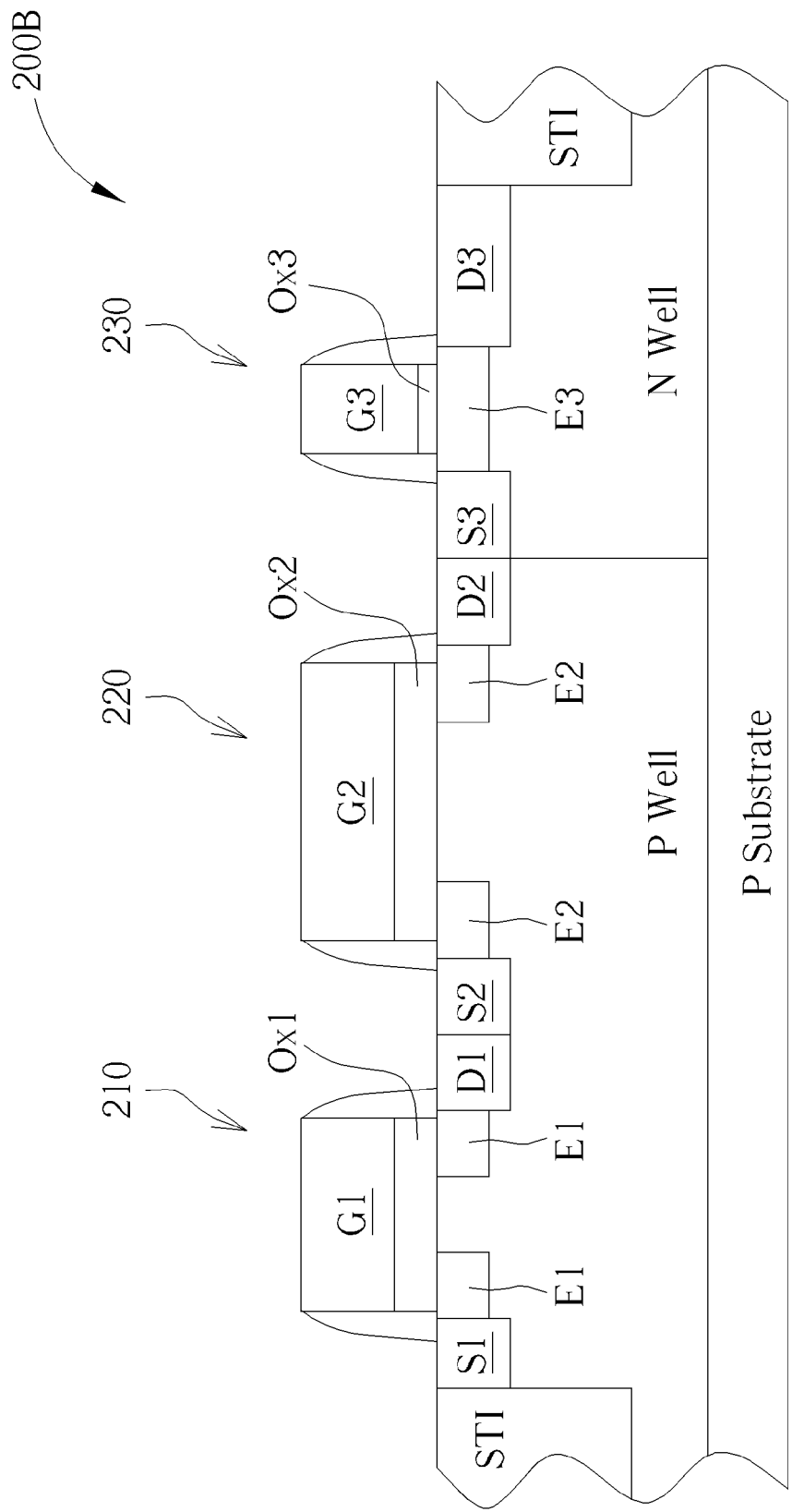
FIG. 7 is a diagram showing a structure of the OTP memory cell according to a third embodiment of the present invention.

Please refer to FIG. 7. FIG. 7 is a diagram showing a structure of the OTP memory cell according to a third embodiment of the present invention. Most features of the OTP memory cell 200B are identical to the OTP memory cell 200A of FIG. 6. As shown in FIG. 7, different from the OTP memory cell 200A of FIG. 6 having gate oxide layers Ox1-Ox3 with a same thickness, the OTP memory cell 200B of FIG. 7 has the gate oxide layers Ox1, Ox2 of the select gate transistor 210 and the following gate transistor 220 with a larger thickness, and the gate oxide layer Ox3 of the antifuse varactor 230 with a smaller thickness. For example, the gate oxide layers Ox1, Ox2 of the select gate transistor 210 and the following gate transistor 220 are for I/O devices, and the gate oxide layer Ox3 of the antifuse varactor 230 is for core devices. Besides, the first source/drain extension areas E1 are formed as deep as the second and third source/drain extension areas E2, E3, that is, the first source/drain extension areas E1 can also be source/drain extension areas for I/O devices.

Figure 8:
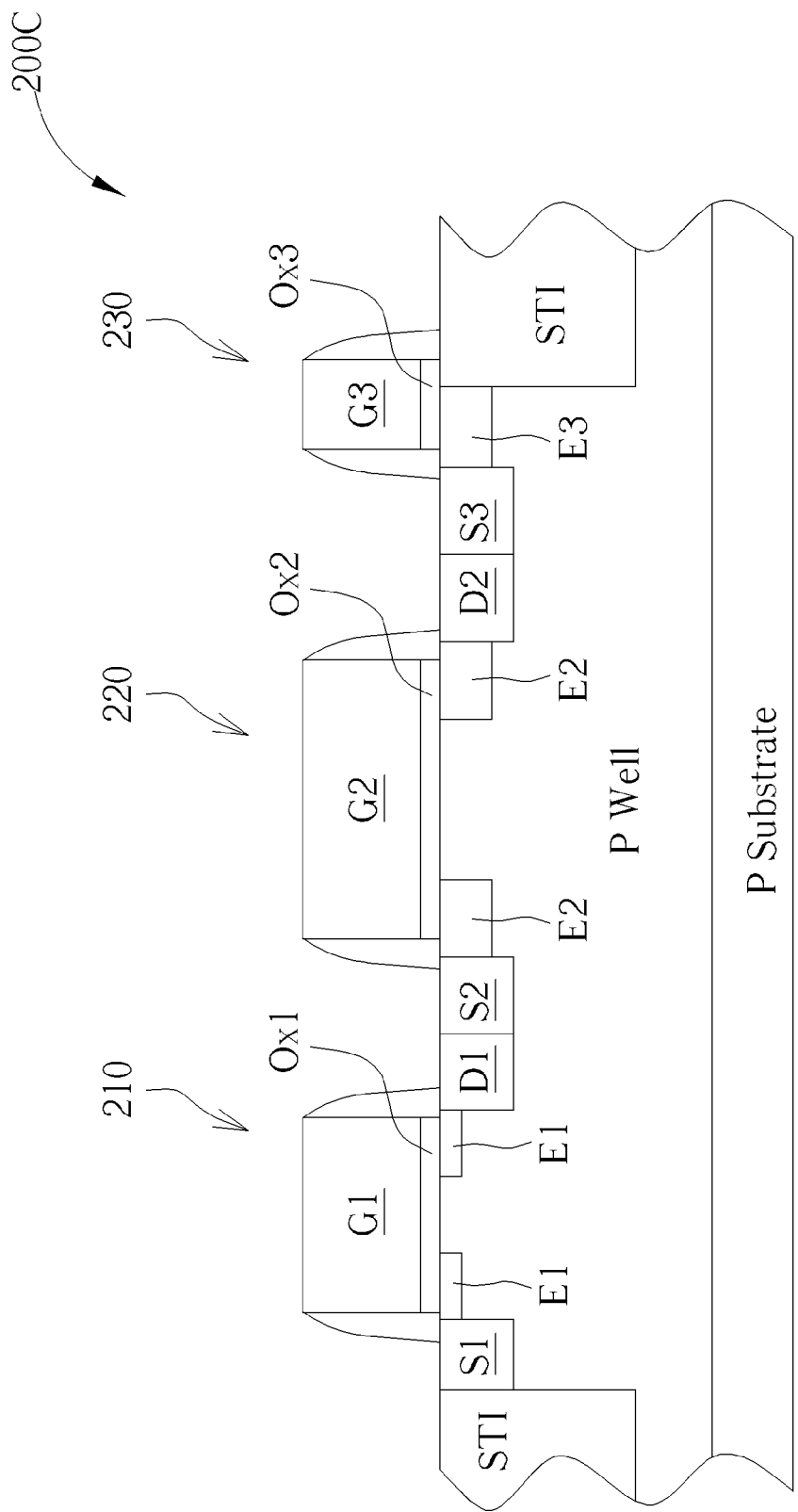
FIG. 8 is a diagram showing a structure of the OTP memory cell according to a fourth embodiment of the present invention.

Please refer to FIG. 8. FIG. 8 is a diagram showing a structure of the OTP memory cell according to a fourth embodiment of the present invention. The select gate transistor 210 and the following gate transistor 220 are identical to those of FIG. 5. As shown in FIG. 8, different from the antifuse varactor 230 of FIG. 5, the drain terminal of the antifuse varactor 230' is replaced by a shallow trench insulation area STI, such that a part of the third gate terminal G3 is formed right above the shallow trench insulation area STI, and rest of the third gate terminal G3 is formed right above the third source/drain extension area E3. According to the above arrangement, the antifuse varactor 230' has no channel, therefore, when programming the OTP memory cell 200C, the gate oxide layer Ox3 of the antifuse varactor 230' is ensured to be ruptured on the third source/drain extension area E3, which is close to the third source terminal S3, so as to reduce possibility of current escaping through the channel.

Figure 9:
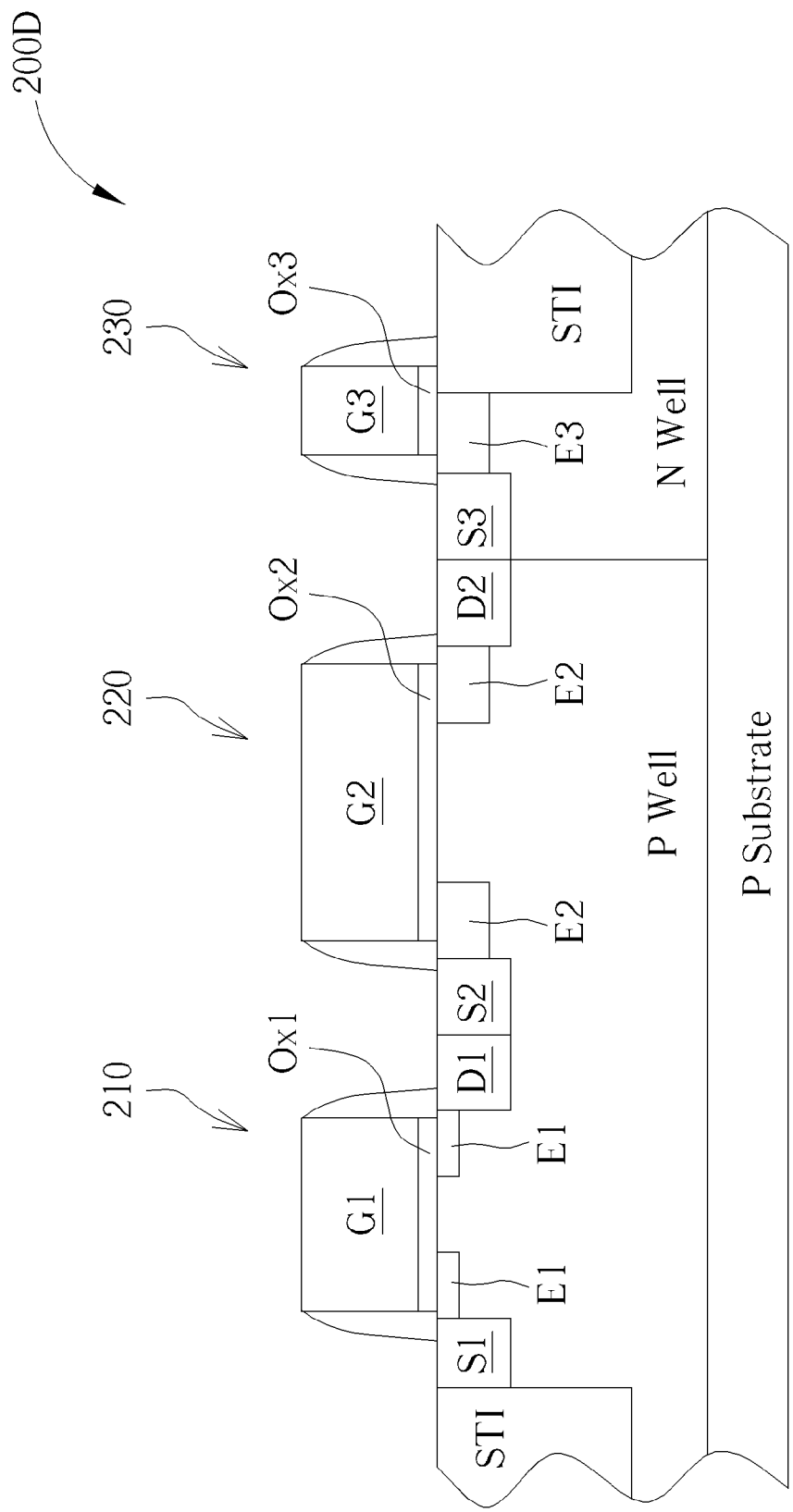
FIG. 9 is a diagram showing a structure of the OTP memory cell according to a fifth embodiment of the present invention.

Please refer to FIG. 9. FIG. 9 is a diagram showing a structure of the OTP memory cell according to a fifth embodiment of the present invention. Most features of the OTP memory cell 200D are identical to the OTP memory cell 200C of FIG. 8. As shown in FIG. 9, different from the OTP memory cell 200C of FIG. 8 all forming on a P well, the OTP memory cell 200D of FIG. 9 has the select gate transistor 210 and the following gate transistor 220 forming on a P well, and the antifuse varactor 230' forming on an N well. In addition, in the embodiment of FIG. 9, the third source/drain extension area E3 is not necessary, that is, the third source/drain extension area E3 can either exist, or be removed and replaced by the N well.

Figure 10:
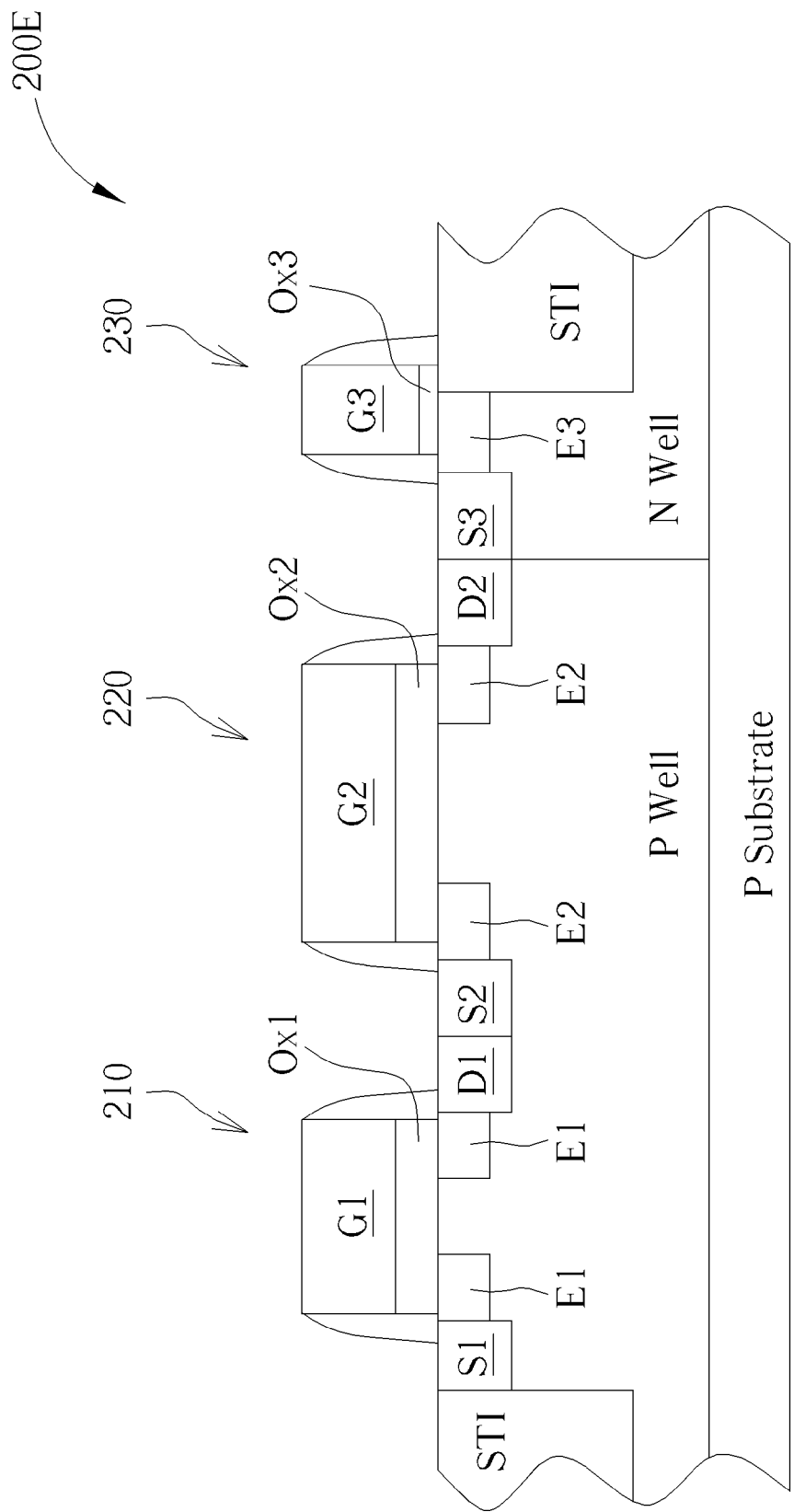
FIG. 10 is a diagram showing a structure of the OTP memory cell according to a sixth embodiment of the present invention.

Please refer to FIG. 10. FIG. 10 is a diagram showing a structure of the OTP memory cell according to a sixth embodiment of the present invention. Most features of the OTP memory cell 200E are identical to the OTP memory cell 200D of FIG. 9. As shown in FIG. 10, different from the OTP memory cell 200D of FIG. 9 having gate oxide layers Ox1-Ox3 with a same thickness, the OTP memory cell of FIG. 10 has the gate oxide layers Ox1, OX2 of the select gate transistor 210 and the following gate transistor 220 with a larger thickness, and the gate oxide layer Ox3 of the antifuse varactor 230' with a smaller thickness. For example, the gate oxide layers Ox1, OX2 of the select gate transistor 210 and the following gate transistor 220 are for I/O devices, and the gate oxide layer Ox3 of the antifuse varactor 230' is for core devices. Besides, the first source/drain extension areas E1 are formed as deep as the second and third source/drain extension areas E2, E3, that is, the first source/drain extension areas E1 can also be source/drain extension areas for I/O devices.

In the above embodiments, the first drain terminal D1 and the second source terminal S2 are integrated as a single terminal, and the second drain terminal D2 and the third source terminal S3 are also integrated as a single terminal, but in other embodiments of the present invention, the first drain terminal D1, the second source terminal S2, the second drain terminal D2, and the third source terminal S3 cab be separated from each other as independent terminals.

Figure 11:
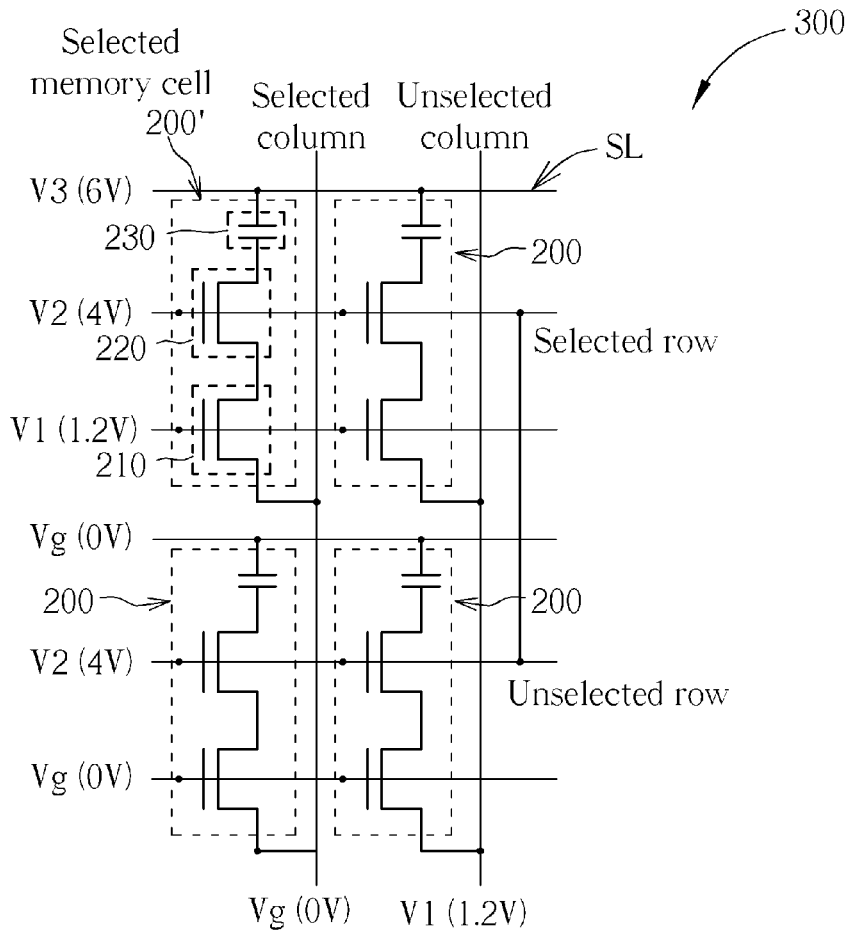
FIG. 11 is a diagram showing a method for programming a memory array comprising the OTP memory cells of the present invention.

Please refer to FIG. 11. FIG. 11 is a diagram showing a method for programming a memory array comprising the OTP memory cells of the present invention. As shown in FIG. 11, when programming the memory array 300 comprising a plurality of OTP memory cells 200, 200' of the present invention, a first voltage V1 (such as 1.2V) is provided to the first gate terminals of the OTP memory cells at a selected row, a second voltage V2 (such as 4V) is provided to all of the second gate terminals of the memory array 300, and a third voltage V3 (such as 6V) is provided to the third gate terminals of the selected memory cell 200'. Besides, a ground voltage Vg (such as 0V) is provided to the first source terminals of a selected column via a bit line BL.

According to the above arrangement, the antifuse varactor 230 of the selected memory cell 200' can be ruptured to be a resistor by the third voltage V3, such that data of logic "1" is written into the selected OTP memory cell 200' at the selected row and selected column. On the other hand, for writing data of logic "0" into the selected OTP memory cell 200' at the selected row and column, the voltage level at the third gate terminal can be set at 0V.

In addition, in FIG. 11, for the unselected OTP memory cell 200 at the unselected row and selected column, the ground voltage Vg is provided to the first and third gate terminals of the unselected row; for the unselected OTP memory cell 200 at the selected row and unselected column, the first voltage V1 is provided to the first source terminal of the OTP memory cell at the unselected column; and for the unselected OTP memory cells 200 at the unselected row and unselected column, the ground voltage Vg is provided to the first and third gate terminals of the OTP memory cell, and the first voltage V1 is provided to the first source terminals of the OTP memory cell. Therefore, the unselected OTP memory cells 200 at the unselected row and/or unselected column can be set in a program inhibition status.

Figure 12:
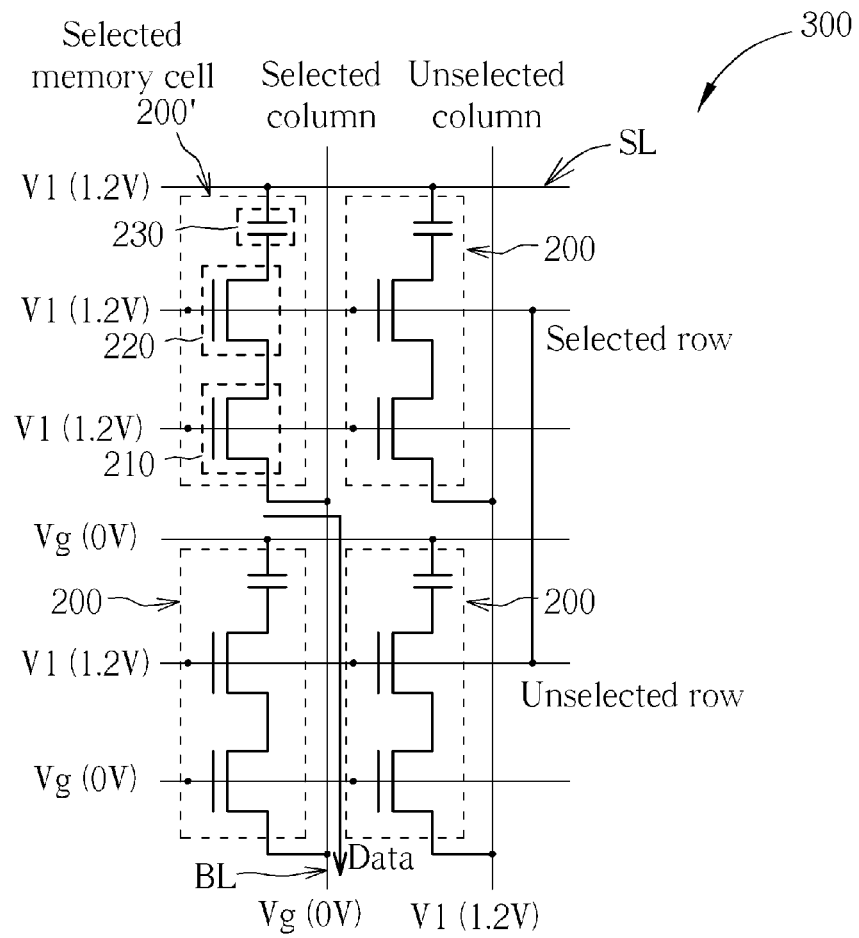
FIG. 12 is a diagram showing a method for reading a memory array comprising the OTP memory cells of the present invention.

Please refer to FIG. 12. FIG. 12 is a diagram showing a method for reading a memory array 300 comprising the OTP memory cells of the present invention. As shown in FIG. 12, when reading data from the memory array 300, a first voltage V1 (such as 1.2V) is provided to the first and third gate terminals of the OTP memory cells at the selected row, and the first voltage V1 is also provided to all of the second gate terminals of the memory array 300. Besides, a ground voltage Vg (such as 0V) is provided to the first source terminals of the OTP memory cells at a selected column.

According to the above arrangement, data stored in a selected OTP memory cell 200' at the selected row and column can be read via a bit line BL coupled to the first source terminals of the selected column.

In addition, in FIG. 12, for the unselected OTP memory cell 200 at the unselected row and selected column, the ground voltage Vg is provided to the first and third gate terminals of the OTP memory cells at the unselected row; for the unselected OTP memory cell 200 at the selected row and unselected column, the first voltage V1 is provided to the first source terminal of the OTP memory cell at the unselected column; and for the unselected OTP memory cell 200 at the unselected row and unselected column, the ground voltage Vg is provided to the first and third gate terminals of the OTP memory cell, and the first voltage V1 is provided to the first source terminal of the OTP memory cell. Therefore, the unselected OTP memory cells 200 at the unselected row and/or unselected column can be set in a read inhibition status.

In the embodiment of FIG. 12, the OTP memory cell 200, 200' is illustrated by the OTP memory cell having the select gate transistor and the following gate transistor with oxide layers for core devices, however, the OTP memory cells 200, 200' of FIG. 12 can also be replaced by the OTP memory cell having the select gate transistor and the following gate transistor with oxide layers for I/O devices, in that case, the first voltage V1 can be set higher (such as 2.5V).

Figure 13:
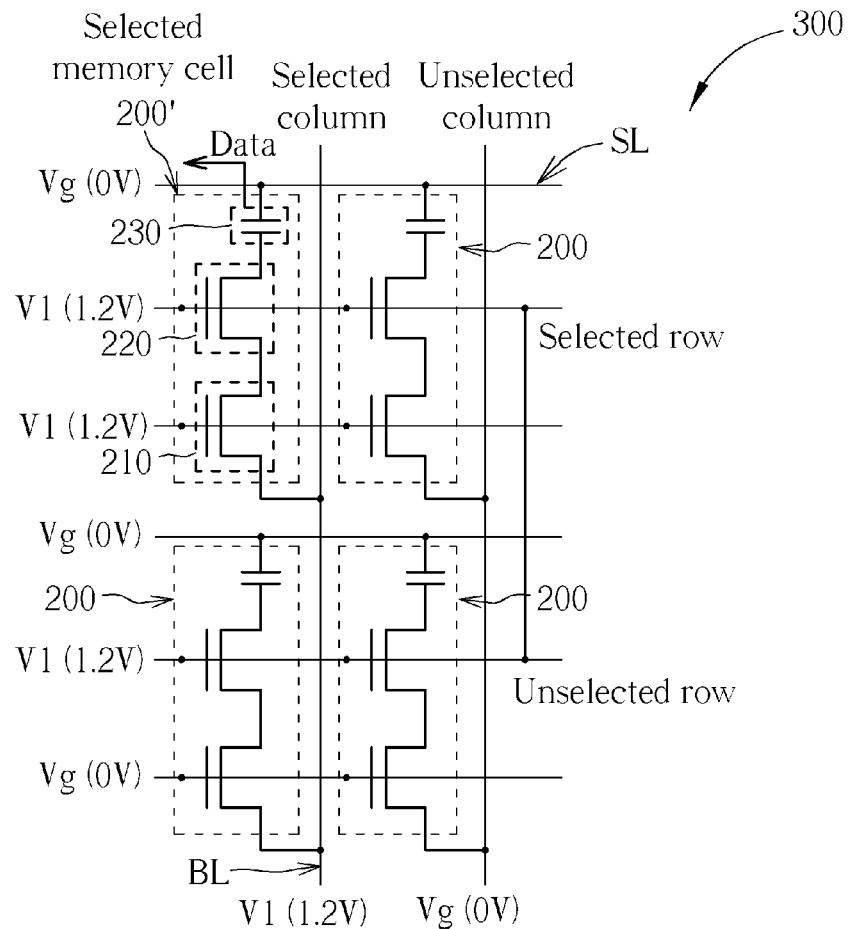
FIG. 13 is a diagram showing another method for reading a memory array comprising the OTP memory cells of the present invention.

Since the antifuse varactor 230 the OTP memory cell 200 has no channel, the memory array comprising the OTP memory cells of the present invention is able to perform a reverse read operation according to an operation bias condition different from the embodiment of FIG. 12. For example, please refer to FIG. 13. FIG. 13 is a diagram showing another method for reading a memory array comprising the OTP memory cells of the present invention. As shown in FIG. 13, when reading data from the memory array 300, a first voltage V1 (such as 1.2V) is provided to the first gate terminals of the OTP memory cells at the selected row, the first voltage V1 is also provided to all of the second gate terminals of the memory array 300, and a ground voltage Vg (such as 0V) is provided to all of the third gate terminals of the memory array 300. Besides, the first voltage V1 is also provided to the first source terminals of the OTP memory cells at a selected column via the bit line BL. The ground voltage Vg provided to the third gate terminal of the selected memory cell 200' works as a reverse read voltage. The reverse read voltage is not necessary to be set at a ground level, the reverse read voltage can be set at other voltage level lower than the first voltage V1.

According to the above arrangement, data stored in a selected OTP memory cell 200' at the selected row and column can be read via a signal line SL coupled to the third gate terminals of the selected row. The reading direction of the selected OTP memory cell in FIG. 13 is opposite to the reading direction of the selected OTP memory cell in FIG. 12. Therefore, the selected OTP memory cell 200' can perform both forward reading operation (as shown in FIG. 12) and reverse reading operation (as shown in FIG. 13) smoothly, since the rupture position of the antifuse varactor 230 is ensured to be on the third source/drain extension area.

In addition, in FIG. 13, for the unselected OTP memory cell 200 at the unselected row and selected column, the ground voltage Vg is provided to the first gate terminal of the OTP memory cell at the unselected row; for the unselected OTP memory cell 200 at the selected row and unselected column, the ground voltage is provided to the first source terminal of the OTP memory cell at the unselected column; and for the unselected OTP memory cell 200 at the unselected row and unselected column, the ground voltage Vg is provided to the first gate terminal of the OTP memory cell, and the ground voltage Vg is also provided to the first source terminal of the OTP memory cell. Therefore, the unselected OTP memory cells 200 at the unselected row and/or unselected column can be set in a read inhibition status.

In the embodiments of FIG. 11 to FIG. 13, the OTP memory cell is illustrated by the OTP memory cell 200 according to the first embodiment of FIG. 5, however, the OTP memory cells of FIG. 11 to FIG. 13 can also be replaced by the OTP memory cell 200A-200E according to the second to sixth embodiments of the present invention. The voltage ranges shown in FIG. 11 to FIG. 13 are applicable to a memory array made in a 40 nm process, and the present invention is not limited by the above voltage ranges. In other embodiments of the present invention, the voltage ranges can be changed according to processes at different scales.

In contrast to the prior art, the OTP memory cell of the present invention can reduce current leakage of the OTP memory cell by utilizing a MOS varactor for storing data, such that problems of slow bit response and malfunction can be prevented. Furthermore, the following gate transistor provides unique advantages in this invention. During program operation, the second gate terminal is biased to higher voltage than first gate terminal. It can form a cascade series transistor to resist high voltage damage from third gate terminal when antifuse is ruptured. Also second drain extension that adopts deeper depth can improve PN junction breakdown at drain side of following gate transistor. Besides, the OTP memory cell of the present invention is capable of performing both forward reading operation and reverse reading operation, so as to improve efficiency for reading operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A one time programmable (OTP) memory cell, comprising:
   a select gate transistor, having a first gate terminal, a first drain terminal, a first source terminal, and two first source/drain extension areas respectively coupled to the first drain terminal and the first source terminal;
   a following gate transistor, having a second gate terminal, a second drain terminal, a second source terminal coupled to the first drain terminal, and two second source/drain extension areas respectively coupled to the second drain terminal and the second source terminal; and
   an antifuse varactor, having a third gate terminal, a third drain terminal, a third source terminal coupled to the second drain terminal, and a third source/drain extension area coupled with the third drain terminal and the third source terminal for shorting the third drain terminal and the third source terminal;
   wherein each of the first source/drain extension areas has a first depth, and each of the second and third source/drain extension areas has a second depth deeper than the first depth.

2. The OTP memory cell of claim 1, wherein the first gate terminal, second gate terminal and third gate terminal are formed on a first gate oxide layer with same first thickness.

3. The OTP memory cell of claim 1, wherein the first gate terminal is formed on a first gate oxide layer with a first thickness, the second gate terminal is formed on a second gate oxide layer with the first thickness, and the third gate terminal is formed on a third gate oxide layer with a second thickness smaller than the first thickness.

4. The OTP memory cell of claim 1, wherein horizontal edges of the third gate terminal are within horizontal edges of the third source/drain extension area.

5. A method for programming a memory array, comprising:
   providing a memory array comprising a plurality of the OTP memory cells of claim 1;
   providing a first voltage to the first gate terminals of the OTP memory cells at a selected row;
   providing a second voltage to all of the second gate terminals of the memory array;
   providing a third voltage to the third gate terminals of the OTP memory cells at the selected row;
   providing a ground voltage to the first source terminals of the OTP memory cells at a selected column;
   providing the first voltage to the first source terminals of the OTP memory cells at an unselected column;
   providing the ground voltage to the first gate terminals of the OTP memory cells at an unselected row; and
   providing the ground voltage to the third gate terminals of the OTP memory cells at the unselected row;
   wherein the third voltage is greater than the first and the second voltages, and the first to third voltages are greater than the ground voltage.

6. A method for reading a memory array, comprising:
   providing a memory array comprising a plurality of the OTP memory cells of claim 1;
   providing a first voltage to the first gate terminals of the OTP memory cells at a selected row;
   providing the first voltage to all of the second gate terminals of the memory array;
   providing the first voltage to the third gate terminals of the OTP memory cells at the selected row;
   providing a ground voltage to the first source terminals of the OTP memory cells at a selected column;
   reading stored data via a bit line coupled to the first source terminals of the OTP memory cells at the selected column;
   providing the first voltage to the first source terminals of the OTP memory cells at an unselected column;
   providing the ground voltage to the first gate terminals of the OTP memory cells at an unselected row; and
   providing the ground voltage to the third gate terminals of the OTP memory cells at the unselected row;
   wherein the first voltage is greater than the ground voltage.

7. A method for reading a memory array, comprising:
   providing a memory array comprising a plurality of the OTP memory cells of claim 1;
   providing a first voltage to the first gate terminals of the OTP memory cells at a selected row;
   providing the first voltage to all of the second gate terminals of the memory array;
   providing a ground voltage to all of the third gate terminals of the memory array;
   providing the first voltage to the first source terminals of the OTP memory cells at a selected column;
   reading stored data via a signal line coupled to the third gate terminals of the OTP memory cells at the selected row;
   providing the ground voltage to the first source terminals of the OTP memory cells at an unselected column; and
   providing the ground voltage to the first gate terminals of the OTP memory cells at an unselected row;
   wherein the first voltage is greater than the ground voltage.

8. A method for reading a memory array, comprising:
   providing a memory array comprising a plurality of the OTP memory cells of claim 1;
   providing a first voltage to turn on the select gate transistor and the following gate transistor of a selected OTP memory cell;
   providing a reverse read voltage to the anitfuse varactor of the selected OTP memory cell;
   providing a second voltage to a bit line which is coupled to the first source terminal of the selected OTP memory cell;
   reading stored data via a signal line coupled to the third gate terminal of the selected OTP memory cell;

providing the ground voltage to the first source terminals of the OTP memory cells at an unselected column; and providing the ground voltage to the first gate terminals of the OTP memory cells at an unselected row;

wherein the second voltage is greater than the reverse read voltage.

9. A one time programmable (OTP) memory cell, comprising:

a select gate transistor, having a first gate terminal, a first drain terminal, a first source terminal, and two first source/drain extension areas respectively coupled to the first drain terminal and the first source terminal;

a following gate transistor, having a second gate terminal, a second drain terminal, a second source terminal coupled to the first drain terminal, and two second source/drain extension areas respectively coupled to the second drain terminal and the second source terminal; and an antifuse varactor, having a third gate terminal, a third drain terminal, a third source terminal coupled to the second drain terminal, and a third source/drain extension area coupled with the third drain terminal and the third source terminal for shorting the third drain terminal and the third source terminal;

wherein the first source/drain extension areas have a first depth, the third source/drain extension areas have a second depth deeper than the first depth, and the following gate transistor has an asymmetric source/drain extension.

10. The OTP memory cell of claim 9, wherein the select gate transistor, and the following gate transistor are formed on a P well, and the antifuse varactor is formed on an N well.

* * * * *